(12) United States Patent
Su et al.

(10) Patent No.: US 10,021,783 B2
(45) Date of Patent: Jul. 10, 2018

(54) SUPPORT STRUCTURE AND MANUFACTURE METHOD THEREOF

(71) Applicant: CHUNGHWA PRECISION TEST TECH. CO., LTD., Taoyuan (TW)

(72) Inventors: Yung-Tai Su, Taoyuan (TW); Ching-Fang Cheng, Taoyuan (TW); Ti-Chiang Chiu, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 0 days.

(21) Appl. No.: 15/435,320

(22) Filed: Feb. 17, 2017

(65) Prior Publication Data

US 2017/0332490 A1 Nov. 16, 2017

(30) Foreign Application Priority Data

May 16, 2016 (TW) .............................. 105115094 A

(51) Int. Cl.
| | |
|---|---|
| *H05K 1/03* | (2006.01) |
| *H05K 1/11* | (2006.01) |
| *H05K 1/09* | (2006.01) |
| *H05K 3/34* | (2006.01) |
| *H05K 3/40* | (2006.01) |

(52) U.S. Cl.
CPC .............. *H05K 1/111* (2013.01); *H05K 1/09* (2013.01); *H05K 1/115* (2013.01); *H05K 3/3436* (2013.01); *H05K 3/4007* (2013.01); *H05K 3/4038* (2013.01); *H05K 2201/0364* (2013.01); *H05K 2201/10734* (2013.01)

(58) Field of Classification Search
CPC .......... H05K 1/111; H05K 1/09; H05K 1/115; H05K 1/141; H05K 3/225; H05K 3/301; H05K 3/3436; H05K 3/3447; H05K 3/4007; H05K 3/4038; H05K 2201/049; H05K 2201/0364; H05K 2201/2018; H05K 2201/2027; H05K 2201/10333; H05K 2201/107; H05K 2203/167
USPC ............................................ 174/255; 439/70
See application file for complete search history.

(56) References Cited

U.S. PATENT DOCUMENTS

| | | | | |
|---|---|---|---|---|
| 9,627,784 B1 * | 4/2017 | Gaynes | .................. | H01R 12/51 |
| 2002/0041025 A1 * | 4/2002 | Tomihara | .............. | H01L 21/561 |
| | | | | 257/730 |
| 2003/0096514 A1 * | 5/2003 | Ho | .......................... | H05K 1/141 |
| | | | | 439/70 |
| 2003/0218262 A1 * | 11/2003 | Saga | ...................... | H01L 21/561 |
| | | | | 257/787 |
| 2006/0037777 A1 * | 2/2006 | Watanbe | ................. | H05K 1/183 |
| | | | | 174/260 |

(Continued)

*Primary Examiner* — Timothy Thompson
*Assistant Examiner* — Guillermo Egoavil
(74) *Attorney, Agent, or Firm* — JMB Davis Ben-David

(57) ABSTRACT

A support structure located at a bottom of a ball grid array (BGA) is provided. The support structure includes a printed circuit board (PCB) having first positioning pin holes, an interface plate having second positioning pin holes which correspond to the first positioning pin holes arranged on the PCB, a support film arranged on the PCB and having support portions, and positioning components penetrating the first positioning pin holes and the second positioning pin holes corresponding to the first positioning pin holes to assemble the support film on the PCB and the interface plate.

2 Claims, 3 Drawing Sheets

(56) References Cited

U.S. PATENT DOCUMENTS

2010/0193948 A1\* 8/2010 Ohta ................. H01L 23/49811
 257/738

\* cited by examiner

SUPPORT STRUCTURE AND MANUFACTURE METHOD THEREOF

CROSS-REFERENCE TO RELATED APPLICATIONS

Benefit is claimed to Taiwan Patent Application No. 105115094, filed May 16, 2016; the contents of which are incorporated by reference herein in their entirety.

BACKGROUND OF THE INVENTION

1. Field of the Invention

The present invention relates to a support structure and a manufacture method of the support structure, and more particularly, to a support structure located at the bottom of a ball grid array (BGA) and a manufacture method of the support structure.

2. Description of the Prior Art

Glue, such as Epoxy, is pouring to IC components or a substrate on a PCB assembly (PCBA) in a testing device before the bottom of a printed circuit board (PCB) is stuffed with glue in the conventional technology related to the field of fabrication of an integrated circuit (IC) and a wafer testing device. Then, the PCBA is baked in an oven before the IC or the substrate is fixed on the baked PCBA. In this way, products having the IC and the wafer testing device have stronger resistance to pressure and impact.

Conventionally, a standard operation is to feed the device glue artificially or dispense the device glue mechanically. That is, the ball grid array (BGA) type components are packed with glue or dispensed with glue and baked with an oven or reflow to enhance the solidity of the structure. However, the problem of the method is that it is hard to dismantle and maintain the device after the device is completed. Besides, any damaged BGA type components are not replaceable; instead, the device needs to be scrapped entirely, which makes the production costs obviously high.

To stabilize the reliability of reworking and pressure impact when a substrate or an interface plate is welded on the PCB and to improve reworkability of reflow welding, it is necessary to propose a support structure to improve resistance to pressure and impact and reworking operation after reflow.

SUMMARY OF THE INVENTION

An object of the present invention is to solve the problem that it is hard to dismantle and maintain the device after the device is fed with glue artificially or dispensed with glue mechanically in the conventional technology. Besides, any damaged BGA type components are not replaceable; instead, the device needs to be scrapped entirely. It shows that the production costs are obviously high.

According to the present invention, a support structure located at a bottom of a ball grid array (BGA) is proposed. The support structure includes a printed circuit board (PCB), a substrate, a support film, and a plurality of positioning components. The printed circuit board (PCB) includes a plurality of first positioning pin holes. The interface plate includes a plurality of second positioning pin holes, corresponding to the plurality of first positioning pin holes arranged on the PCB, respectively. The support film arranged on the PCB includes a plurality of support portions. The plurality of positioning components penetrate the plurality of first positioning pin holes and the plurality of second positioning pin holes corresponding to the plurality of first positioning pin holes to assemble the support film on the PCB and the interface plate.

According to another embodiment of the present invention, a plurality of copper columns are arranged below the interface plate, and a plurality of pads are arranged on the PCB and correspond to locations of the plurality of copper columns.

According to another embodiment of the present invention, a solder paste is coated on the pad to fix the plurality of copper columns. The support portion is arranged between every two adjacent copper columns. The length of each of the plurality of copper columns is smaller than the length of the support portion.

According to the present invention, a support structure located at a bottom of a ball grid array (BGA) is proposed. The support structure includes a printed circuit board (PCB), a substrate, a support film, and a plurality of positioning components. The printed circuit board (PCB) includes a plurality of first positioning pin holes. The substrate includes a plurality of second positioning pin holes and corresponding to the plurality of first positioning pin holes arranged on the PCB, respectively. The support film is arranged on the PCB includes a plurality of support portions. The plurality of positioning components penetrate the first positioning pin hole and the second positioning pin hole corresponding to the first positioning pin hole to assemble the support film on the PCB and the interface plate.

According to another embodiment of the present invention, a plurality of copper columns are arranged below the substrate, and a plurality of pads are arranged on the PCB and correspond to locations of the plurality of copper columns.

According to another embodiment of the present invention, a solder paste is coated on the pad to fix the plurality of copper columns; the support portion is arranged between every two adjacent copper columns; the length of each of the plurality of copper columns is shorter than the length of the support portion.

According to the present invention, a method of manufacturing a support structure, located at a bottom of a ball grid array (BGA) includes steps of: fabricating a plurality of first positioning pin holes on a printed circuit board (PCB); arranging a plurality of second positioning pin holes on an interface plate, and corresponding the plurality of second positioning pin holes to the plurality of first positioning pin holes arranged on the PCB, respectively; arranging a support film on the PCB, and comprising a plurality of support portions; and assembling the support film on the PCB and a positioning component of the interface plate by penetrating the first positioning pin hole and a positioning component of the second positioning pin hole corresponding to the first positioning pin hole.

According to another embodiment of the present invention, a plurality of copper columns are arranged below the interface plate at the bottom of the BGA, and a plurality of pads are arranged on the PCB and correspond to locations of the plurality of copper columns.

According to another embodiment of the present invention, a solder paste is coated on the pad to fix the plurality of copper columns; the support portion is arranged between every two adjacent copper columns; the length of each of the plurality of copper columns is smaller than the length of the support portion.

According to the present invention, a method of manufacturing a support structure, located at a bottom of a ball grid array (BGA) includes steps of: fabricating a plurality of first positioning pin holes on a printed circuit board (PCB); arranging a plurality of second positioning pin holes on a substrate, and corresponding the plurality of second positioning pin holes to the plurality of first positioning pin holes arranged on the PCB, respectively; arranging a support film on the PCB, and comprising a plurality of support portions; and assembling the support film on the PCB and a positioning component of the substrate by penetrating the first positioning pin hole and a positioning component of the second positioning pin hole corresponding to the first positioning pin hole.

According to another embodiment of the present invention, a plurality of copper columns are arranged below the substrate, and a plurality of pads are arranged on the PCB and correspond to locations of the plurality of copper columns.

According to another embodiment of the present invention, a solder paste is coated on the pad to fix the plurality of copper columns. The support portion is arranged between every two adjacent copper columns. The length of each of the plurality of copper columns is smaller than the length of the support portion.

In contrast to related art, pin holes are additionally arranged on opposite positions of a substrate or an interface plate and a PCB to realize pin insertion fix and to improve the condition of pressure impact produced during the testing process or rework replacement during the testing process in the present invention.

DETAILED DESCRIPTION OF THE PREFERRED EMBODIMENTS

These and other objectives of the claimed invention will no doubt become obvious to those of ordinary skill in the art after reading the following detailed description of the preferred embodiment that is illustrated in the various figures and drawings.

Figure 1:
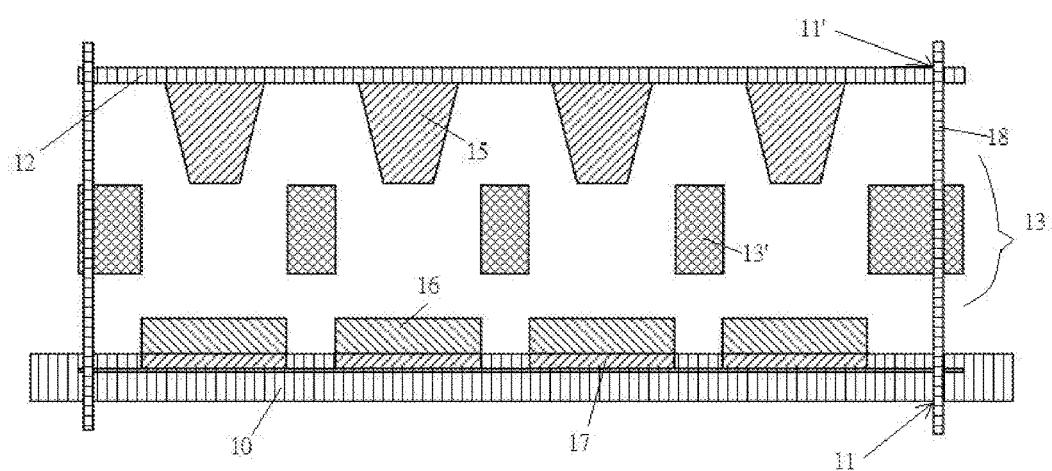
FIG. 1 is a schematic diagram of the support structure according to the first embodiment of the present invention.
Figure 2:
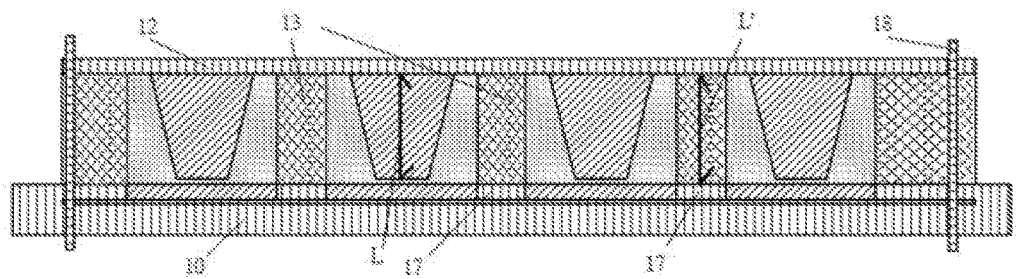
FIG. 2 is a sectional view of the assembled support structure as shown in FIG. 1.

A support structure is disclosed by a first preferred embodiment of the present invention. The support structure is arranged on the bottom of a ball grid array (BGA). Please refer to FIG. 1 and FIG. 2. FIG. 1 is a schematic diagram of the support structure according to the first embodiment of the present invention. FIG. 2 is a sectional view of the assembled support structure as shown in FIG. 1. To protect the support structure from being affected by the pressure or the impact generated during the testing process or to facilitate reworking replacement during production, the support structure is arranged between a substrate or an interface plate 12 and a printed circuit board assembly (PCBA) in an assembled testing device, and a bottom support is added in the support structure. To realize the method of support with the bottom, positioning pin holes need to be arranged opposite between the substrate or the interface plate 12 and the PCB 10. In other words, the PCB 10 comprises a plurality of first positioning holes 11, and the interface plate 12 comprises a plurality of second positioning holes 11' corresponding to the plurality of first positioning holes 11, respectively. In this way, the pins can fix the device firmly. A layer of the support film 13 is arranged on the bottom of the support. The support film 13 is arranged on the PCB 10. The support film 13 comprises a plurality of support portions 13'. The support film 13, the PCB 10, and the interface plate 12 are positioned using positioning components 18 penetrating the plurality of first positioning holes 11 and the plurality of second positioning holes 11', which correspond to the plurality of first positioning holes 11.

Preferably, a plurality of copper columns 15 are arranged below the interface plate 12. A plurality of pads 17 are arranged on the PCB 10, and the locations of the plurality of pads 17 correspond to the locations of the plurality of copper columns 15. The support portion 13' is arranged between every two adjacent copper columns 15.

Preferably, a pad 17 is arranged on a welding spot 14. A solder paste 16 is coated on the pad 17 to fix a copper column 15. The support portion 13' is arranged between every two adjacent copper columns 15. The length L of each of the plurality of copper columns 15 is smaller than the length L' of the support portion 13' so that the plurality of copper columns 15 cannot contact the pad 17. In this way, the length L of the plurality of copper columns 15 on the pad 17 is roughly the same rather than being different because of possible errors, so the difficulty of reworking does not increase. Besides, the length L' of the support portion 13' is larger than the length of each of the plurality of copper columns 15. Even if the length of each of the plurality of copper columns 15 is different, the assembly is not affected. Also, the support portion 13' fills the space in the present invention, which replaces the solder-filled area designed in the conventional technology. Therefore, the support film 13 for adhesion can be peeled off during the process of reworking, which is good for dismantling the device effortlessly. In this way, it is more convenient to operate reworking.

Another support structure is proposed by the present invention. Differing from the support structure proposed by the embodiments as shown in FIG. 1 and FIG. 2, a substrate is substituted for the interface plate in the support structure proposed by the first embodiment of the present invention.

Figure 3:
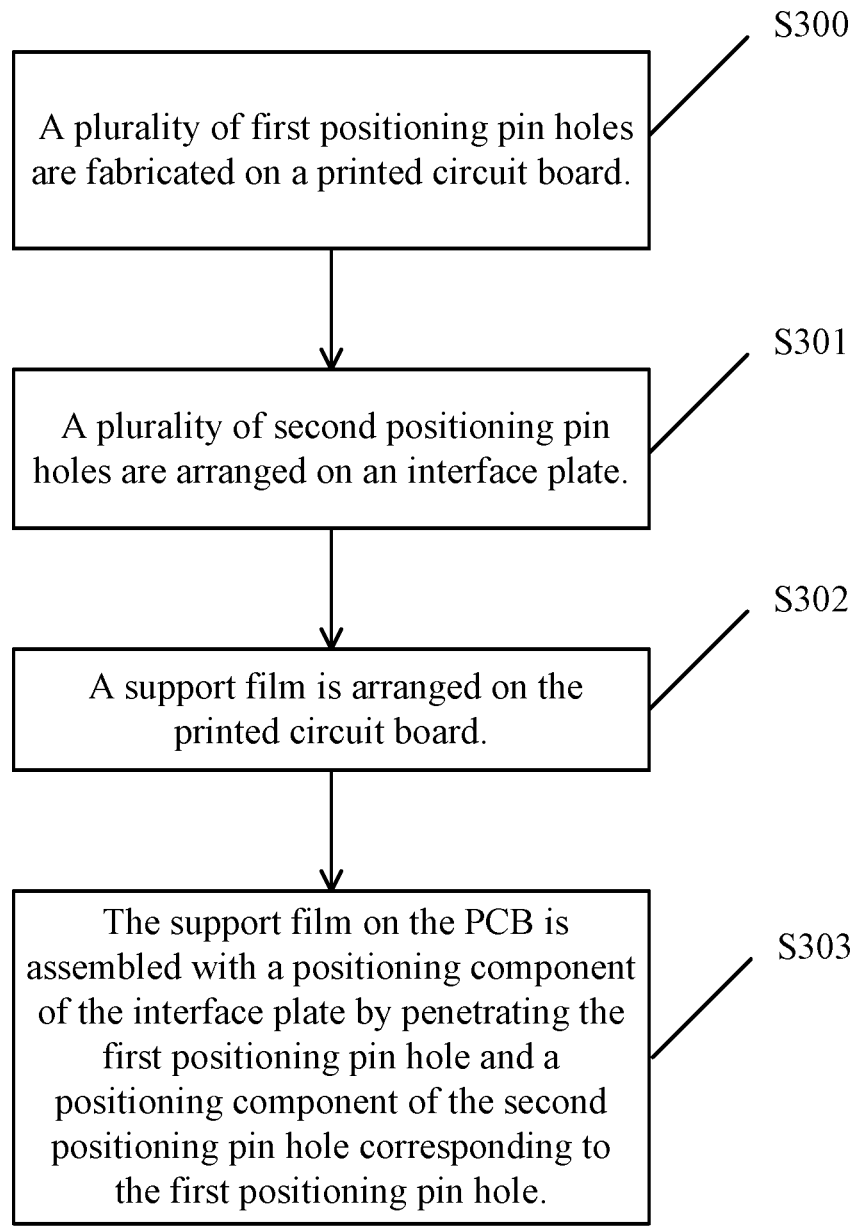
FIG. 3 is a flow chart of a method of manufacturing a support structure according to the second embodiment of the present invention.

A manufacture method of a support structure is disclosed by a second preferred embodiment of the present invention, as shown in FIG. 3. FIG. 3 is a flow chart of a method of manufacturing a support structure according to the second embodiment of the present invention. This method comprises the following steps.

Step S300: Fabricate a plurality of first positioning pin holes on a printed circuit board (PCB).

Step S301: Arrange a plurality of second positioning pin holes on an interface plate.

Step S302: Arrange a support film on the PCB.

Step S303: Combine the support film on the PCB and a positioning component of the interface plate by penetrating the first positioning pin hole and a positioning component of the second positioning pin hole corresponding to the first positioning pin hole.

The plurality of second positioning pin holes correspond to the plurality of first positioning pin holes respectively in Step S301. The support film comprises a plurality of support portions in Step S302. A plurality of copper columns are arranged below the interface plate. A plurality of pads are arranged on the PCB and the locations of the plurality of pads correspond to the locations of the plurality of copper columns. A solder paste is coated on the pad to fix the copper column. The support portion is arranged between every two adjacent copper columns. The length of each of the plurality of copper columns is smaller than the length of the support portion so that the plurality of copper columns cannot contact the pad. In this way, the goal of reworking is achieved.

Figure 4:
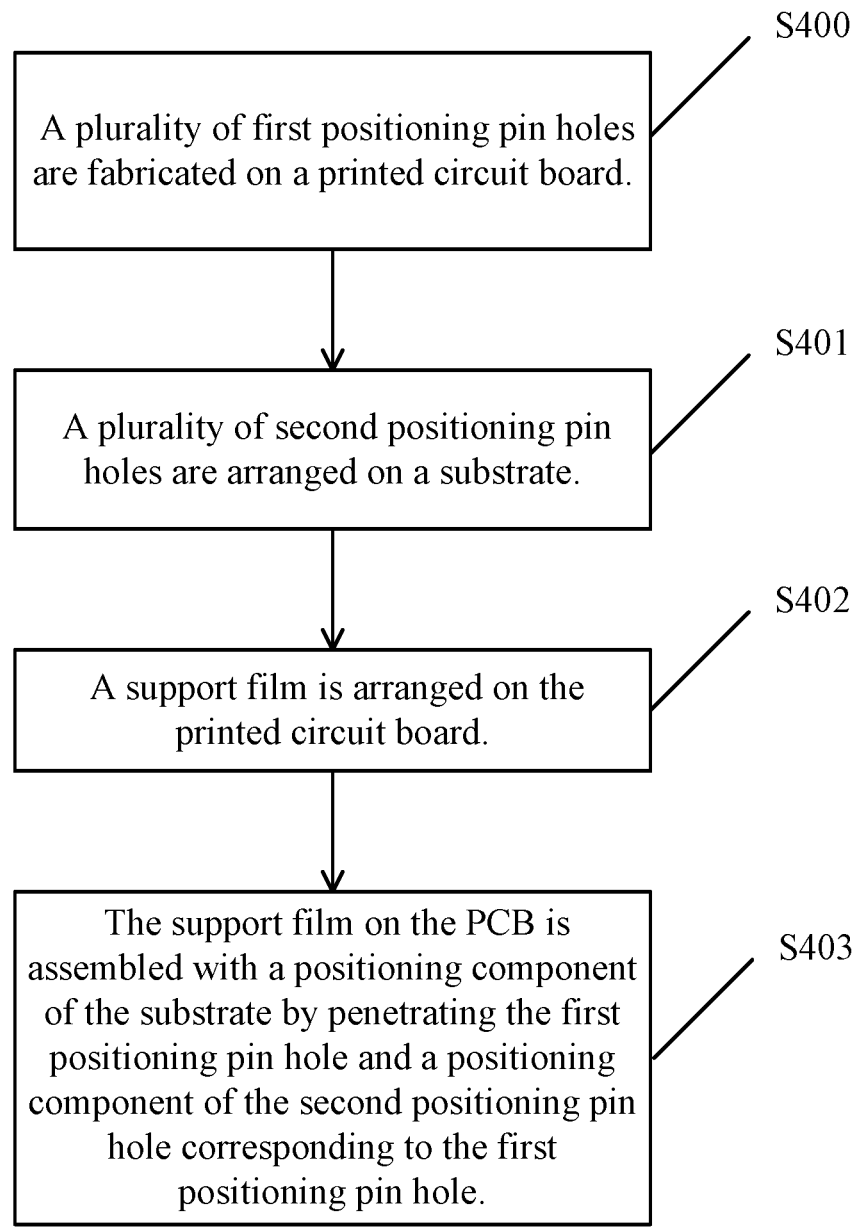
FIG. 4 is a flow chart of a method of manufacturing a support structure according to the third embodiment of the present invention.

A manufacture method of a support structure is disclosed by a third preferred embodiment of the present invention, as shown in FIG. 4. FIG. 4 is a flow chart of a method of manufacturing a support structure according to the third embodiment of the present invention. This method comprises the following steps.

Step S400: Fabricate a plurality of first positioning pin holes on a printed circuit board (PCB).

Step S401: Arrange a plurality of second positioning pin holes on a substrate.

Step S402: Arrange a support film on the PCB.

Step S403: Combine the support film on the PCB and a positioning component of the substrate by penetrating the first positioning pin hole and a positioning component of the second positioning pin hole corresponding to the first positioning pin hole.

The plurality of second positioning pin holes correspond to the plurality of first positioning pin holes respectively in Step S401. The support film comprises a plurality of support portions in Step S402. A plurality of copper columns are arranged below the substrate. A plurality of pads are arranged on the PCB and the locations of the plurality of pads correspond to the locations of the plurality of copper columns. A solder paste is coated on the pad to fix the copper column. The support portion is arranged between every two adjacent copper columns. The length of each of the plurality of copper columns is shorter than that of the support portion so that the plurality of copper columns cannot contact the pad. In this way, the goal of reworking is achieved.

In the embodiments, the first positioning pin hole and the second positioning pin hole may be diagonal two, three, or four holes. However, the volume of the pin holes is not limited by the present invention.

In the present invention, pin holes are additionally arranged on the opposite positions of the substrate or the interface plate and the PCB to realize pin insertion fix and to improve the condition of pressure impact produced during the testing process or rework replacement during the testing process.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A support structure, located at a bottom of a ball grid array (BGA), comprising:
    a printed circuit board (PCB), comprising a plurality of first positioning pin holes;
    an interface plate, comprising a plurality of second positioning pin holes, corresponding to the plurality of first positioning pin holes arranged on the PCB, respectively;
    a support film, arranged on the PCB and comprising a plurality of support portions; and
    a plurality of positioning components, penetrating the plurality of first positioning pin holes and the plurality of second positioning pin holes corresponding to the plurality of first positioning pin holes to assemble the support film on the PCB and the interface plate,
    wherein a plurality of copper columns are arranged below the interface plate, and a plurality of pads are arranged on the PCB and correspond to locations of the plurality of copper columns, and
    wherein a solder paste is coated on the pad to fix the plurality of copper columns; the support portion is arranged between every two adjacent copper columns; the length of each of the plurality of copper columns is smaller than the length of the support portion.

2. A support structure, located at a bottom of a ball grid array (BGA), comprising:
    a printed circuit board (PCB), comprising a plurality of first positioning pin holes;
    a substrate, comprising a plurality of second positioning pin holes and corresponding to the plurality of first positioning pin holes arranged on the PCB, respectively;
    a support film, arranged on the PCB and comprising a plurality of support portions; and
    a plurality of positioning components, penetrating the first positioning pin hole and the second positioning pin hole corresponding to the first positioning pin hole to assemble the support film on the PCB and the substrate,
    wherein a plurality of copper columns are arranged below the substrate, and a plurality of pads are arranged on the PCB and correspond to locations of the plurality of copper columns, and
    wherein a solder paste is coated on the pad to fix the plurality of copper columns; the support portion is arranged between every two adjacent copper columns; the length of each of the plurality of copper columns is shorter than the length of the support portion.

* * * * *